US010998075B2

(12) United States Patent
Huott et al.

(10) Patent No.: US 10,998,075 B2
(45) Date of Patent: May 4, 2021

(54) BUILT-IN SELF-TEST FOR BIT-WRITE ENABLED MEMORY ARRAYS

(71) Applicant: International Business Machines Corporation, Armonk, NY (US)

(72) Inventors: William Huott, Holmes, NY (US); Daniel Rodko, Poughkeepsie, NY (US); Pradip Patel, Poughkeepsie, NY (US); Matthew Steven Hyde, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/567,495

(22) Filed: Sep. 11, 2019

(65) Prior Publication Data

US 2021/0074376 A1 Mar. 11, 2021

(51) Int. Cl.
*G11C 29/38* (2006.01)
*G11C 11/4096* (2006.01)
(Continued)

(52) U.S. Cl.
CPC .......... *G11C 29/38* (2013.01); *G11C 11/4072* (2013.01); *G11C 11/4096* (2013.01); *G11C 29/4401* (2013.01)

(58) Field of Classification Search
CPC ...................................................... G11C 29/38
(Continued)

(56) References Cited

U.S. PATENT DOCUMENTS 5,659,551 A 8/1997 Huott et al.
6,182,257 B1 1/2001 Gillingham
(Continued)

OTHER PUBLICATIONS

Cheng, Allen. Comprehensive Study on Designing Memory BIST: Algorithms, Implementations and Trade-Offs. EECS 679, Fall 2002. Digital System Testing Project Report. Advanced Computer Architecture Lab. Department of Eletrical Engineering and Computer Science. The University of Michigan. Ann Arbor, MI 48109-2122. Dec. 16, 2002, 34 Pages.

(Continued)

*Primary Examiner* — Fritz Alphonse
(74) *Attorney, Agent, or Firm* — Cantor Colburn LLP; William Kinnaman

(57) ABSTRACT

A non-limiting example includes data storage circuitry. The data storage circuitry includes a built-in self-test (BIST) engine. The data storage circuitry includes a memory array including memory cells. The memory array is configured to store data based on a read-write vector associated with an address vector that includes memory addresses and according to a bit-write vector that defines bit-write enablement for the memory addresses. The memory array is configured to output a stored data vector. The data storage circuitry includes a selector configured to receive the bit-write vector, and to output a selected vector based on an initialization vector and a comparison vector based at least in part on the bit-write vector. The data storage circuitry includes a comparator configured to receive the stored data vector and the selected vector, and to output an error based on discrepancies between the stored data vector and the selected vector.

20 Claims, 3 Drawing Sheets

(51) Int. Cl.
*G11C 11/4072* (2006.01)
*G11C 29/44* (2006.01)

(58) Field of Classification Search
USPC .............................. 714/719, 717, 720, 722
See application file for complete search history.

(56) References Cited

U.S. PATENT DOCUMENTS

| | | | |
|---|---|---|---|
| 6,374,370 B1 | 4/2002 | Bockhaus et al. | |
| 6,643,807 B1 | 11/2003 | Heaslip et al. | |
| 6,950,974 B1* | 9/2005 | Wohl | G01R 31/318547 |
| | | | 714/728 |
| 7,237,162 B1* | 6/2007 | Wohl | G01R 31/318547 |
| | | | 714/726 |
| 7,269,766 B2 | 9/2007 | Slobodnik et al. | |
| 7,304,875 B1* | 12/2007 | Lien | G06F 11/1064 |
| | | | 365/200 |
| 7,973,549 B2 | 7/2011 | Joshi et al. | |
| 8,327,207 B2 | 12/2012 | Duffy et al. | |
| 2002/0138801 A1 | 9/2002 | Wang et al. | |
| 2004/0117694 A1 | 6/2004 | Howlett | |
| 2005/0160316 A1* | 7/2005 | Shipton | G06F 21/57 |
| | | | 714/22 |
| 2006/0156117 A1 | 7/2006 | Maruyama | |
| 2008/0016418 A1 | 1/2008 | Evans et al. | |
| 2010/0275014 A1* | 10/2010 | Kelley | G06F 21/51 |
| | | | 713/157 |
| 2011/0055646 A1* | 3/2011 | Mukherjee | G11C 29/44 |
| | | | 714/719 |
| 2013/0159799 A1* | 6/2013 | Brown | G01R 31/318566 |
| | | | 714/726 |

OTHER PUBLICATIONS

List of IBM Patents or Patent Applications Treated as Related; Date Filed: Sep. 12, 2019, 2 Pages.

Saman Adham & Benoit Nadeau-Dostie. A BIST Algorithm for Bit/Group Write Enable Faults in SRAMs. Records of the 2004 International Workshop on Memory Technology, Design and Testing. 2004. 4 Pages.

William Huott, "Sequential Error Capture During Memory Test", U.S. Appl. No. 16/567,508, filed Sep. 12, 2019.

Transmittal Form PTO/SB/21, signed Mar. 17, 2020.

* cited by examiner

BUILT-IN SELF-TEST FOR BIT-WRITE ENABLED MEMORY ARRAYS

BACKGROUND

The present invention relates to bit-write enabled memory arrays, and more specifically, to the use of built-in self-test (BIST) circuitry to check the validity of data written to bit-write enabled memory arrays.

SUMMARY

Embodiments of the present invention are directed to methods, systems, and circuitry for bit-write enabled memory arrays. A non-limiting example includes data storage circuitry. The data storage circuitry includes a built-in self-test (BIST) engine. The data storage circuitry includes a memory array including memory cells. The memory array is configured to store data based on a read-write vector associated with an address vector that includes memory addresses and according to a bit-write vector that defines bit-write enablement for the memory addresses. The memory array is configured to output a stored data vector. The data storage circuitry includes a selector configured to receive the bit-write vector, and to output a selected vector based on an initialization vector and a comparison vector based at least in part on the bit-write vector. The data storage circuitry includes a comparator configured to receive the stored data vector and the selected vector, and to output an error based on discrepancies between the stored data vector and the selected vector.

Embodiments also include a method for operating a built-in self-test (BIST) engine associated with a memory array. The method includes comparing a stored vector received from the memory array defined by a bit-write vector and a selected vector received from the BIST engine defined by the bit-write vector. The method includes repairing the memory array according to the comparing such that differences between the stored vector and the selected vector are stored as repaired memory addresses in the memory array.

Embodiments further include a method for operating a built-in self-test (BIST) engine associated with a memory array. The method includes initializing an initialization vector having initialization vector values and comparison vector based on the initialization vector having comparison vector values defined according to write vector circuitry. The method includes defining a selected vector based on the initialization vector and the comparison vector according to a bit-write vector having bit-write vector values that represent selection logic. The method includes outputting the selected vector.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Computers often include computer readable mediums including data storage circuitry for storing data. The data storage circuitry may include memory arrays having memory cells or segments. A built-in self-test (BIST) engine is often configured to test the memory arrays for defects and faults. For example, a cell or group of cells located within the array may be unable to properly read or write data. The BIST engine may test for functional errors specific to the memory array. As an example, the memory array read and memory array write functionality may be tested according to a read-write vector. A data vector may be written to a group of memory addresses defined by a memory address vector, and the read-write vector may determine which of the particular memory addresses are read or written.

A bit-write vector may be used to control write functionality to specific bits or bit groups associated with the memory array. The bit-write vector may include logical TRUE and FALSE bits for allowing a particular bit to be written (e.g., TRUE) or preventing writing to the particular bit (e.g., FALSE). As such, the bit-write vector may provide a distinct control function to be tested. Circuitry may be required to test bit-write functionality as bit-write enablement may introduce errors independent or coinciding with data written to the memory array. Erroneous data written to the memory may not be detected with other comparison data provided by the BIST engine. Additional comparison data may be necessary to determine the proper operation of bit-write.

The BIST engine replicate the data intended to be written to the memory array. The replicated data may be selected using the bit-write vector. The selected data may be based on the comparison data and initialization data.

Figure 1A:
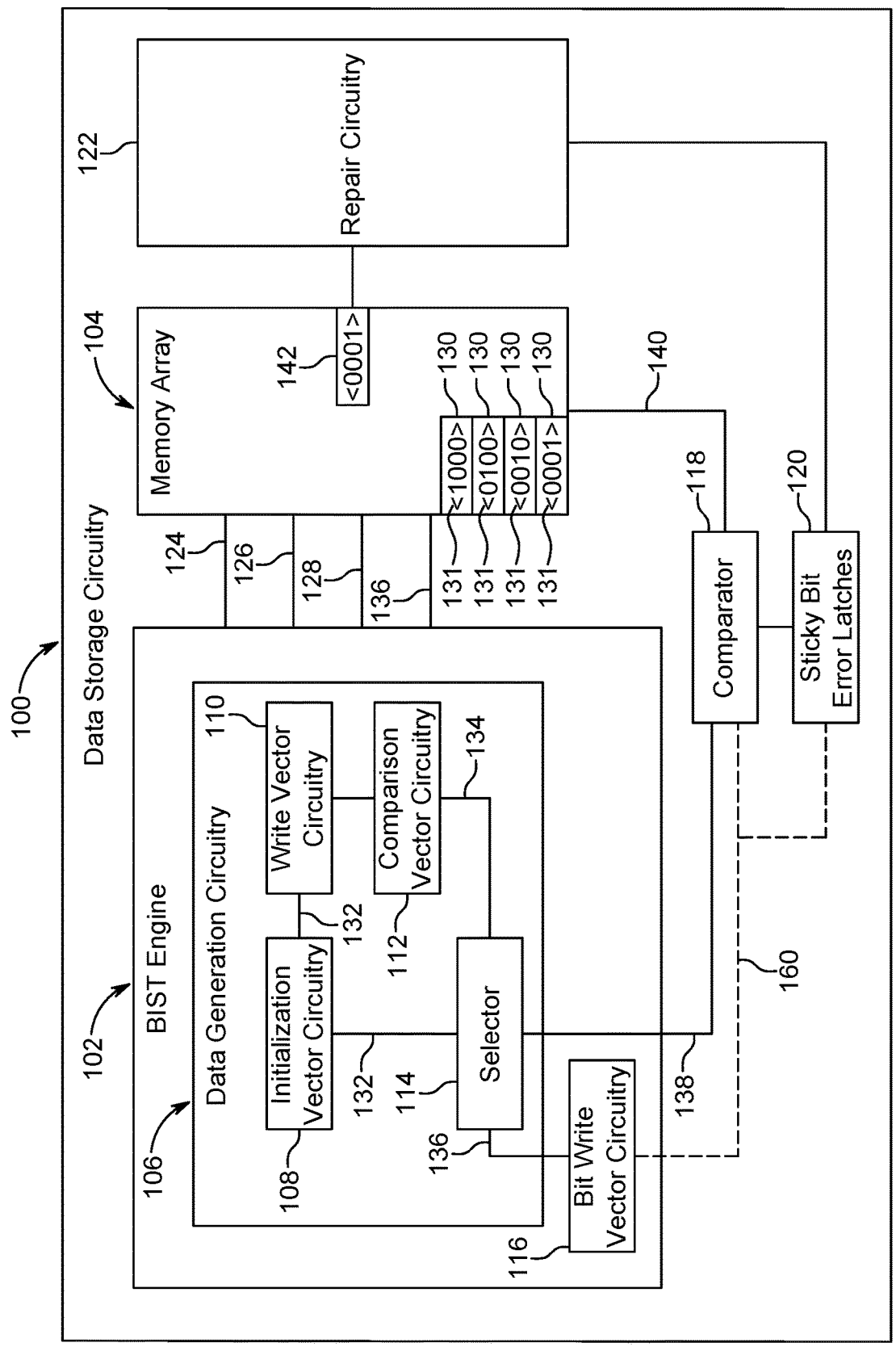
FIG. 1A illustrates a block diagram of data storage circuitry having a built-in self-test (BIST) engine in accordance with one or more embodiments of the present invention.

Referring to FIG. 1A, data storage circuitry 100 in accordance with one or more embodiments of the present invention is shown. The data storage circuitry 100 includes a BIST engine 102 and a memory array 104. The memory array 104 may be any type of memory storage device. As an example, the memory array 104 may be static random-access memory (SRAM), dynamic random-access memory (DRAM), or any other system of cells, latches, flip-flops, or devices configured to retain logical data. The memory array 104 may include individual memory cells 130 associated with respective memory addresses 131.

The BIST engine 102 and the memory array 104 may be implemented on the same printed circuit board, integrated circuit, or other substrate. In one or more other embodiments, the BIST engine 102 and the memory array 104 are disposed on disparate substrates. As shown in FIG. 1, the BIST engine 102 can also include data generation circuitry 106.

The data generation circuitry 106 may generate test data for the memory array 104. The test data may be generated in any fashion. As an example, the test data may include data that is entirely one logic (e.g., TRUE) or another logic (e.g., FALSE). The test data may include functionally defined data based on algorithms, randomly generated data, or combinations thereof. The test data may be represented as vectors configured to travel on buses or bit paths conveying the entire vector or portions thereof. As such, the data generation circuitry 106 may include initialization vector circuitry 108. The initialization vector circuitry 108 may define an initialization vector 132. The initialization vector 132 may be any combination of logical representations for testing the memory array 104. The initialization vector 132 may be derived from hardcoded keys or initialized during manufacture. The initialization vector 132 is provided to the selector 114 and the write vector circuitry 110.

The write vector circuitry 110 is configured to generate an address vector 124 and a read-write vector 126. The address vector 124 includes memory addresses 131. The address vector 124 may include only those memory cells 130 intended to be tested, forming a predetermined set of memory cells. The memory addresses 131 of the address vector 124 may be specific to the memory cells 130 or globally defined according to the memory array 104. The memory addresses 131 may be bitwise representations, <0110>. The memory address 131 may include bit addresses, row addresses, column addresses, or other identifiers of particular memory cells 130. The read-write vector 126 may define the read and write for particular cells or groups of cells of the memory array 104. As an example, the BIST engine 102 may operate a write test cycle where the read-write vector 126 is logically assigned to correspond to each bit being write enabled. The BIST engine 102 may operate a read test cycle where the read-write vector 126 is logically assigned to correspond to each bit being read. The read-write vector 126 may have randomly assigned logical values or functionally assigned values to thoroughly test read write function of the memory array 104. The write vector circuitry 110 may further define a write-data vector 128 to be written to the memory array 104. The write-data vector 128 may be vector of data to be written. The write-data vector 128 may be based on the initialization vector 132.

Comparison vector circuitry 112 is configured to generate a comparison vector 134. The comparison vector 112 may be based on the initialization vector 132 with respect to the read-write vector 126 such that data intended to be written to the memory array 104 is stored in the comparison vector 134. As an oversimplified example for explanatory purposes, the initialization vector 132 may be <0011>, which is written in its entirety to the memory array 104. The write-data vector 128 may be <1100> and the read-write vector 126 may be <1111>, where TRUE logic of the read-write vector 126 allows writing the write-data vector 128 to the memory array 104. As such, the resulting comparison vector 134 may be <1100>.

The data storage circuitry 102, in accordance with one or more embodiments, includes bit-write vector circuitry 116. The bit-write vector circuitry 116 often generate or receive a bit-write vector 136. The bit-write vector 136 may be any number of bits that correspond to an individual or group of memory cells 130 of the memory array 104 being bit-write enabled. The bit-write vector 136 usually controls the writing of individual bits of the memory array 104. As part of the above oversimplified example, the bit-write vector 136 is <1010>. As such, the data written to the memory array 104, outputted as stored data 140, may be <1001> when the memory array 104 is functioning properly.

The BIST engine 102 may include a selector 114. The selector 114 may be a multiplexor or another implement.

The selector 114 is configured to receive the bit-write vector 136 as a control signal input such that the bit-write vector 136 may control selection of the other inputs or portions thereof. The selector 114 is also configured to receive the initialization vector 108 and the comparison vector 112. The selector 114 may be configured to output a selected vector 138. The selected vector 138 may be based on the initialization vector 108 and the comparison vector 112. The selected vector 138 may be selected according to the bit-write vector 136. The selector 114 may select the selected vector 138 using multiplexing techniques or other selection or sequencing implements. As one example, logic values of the bit-write vector 136 select whether to use values from the initialization vector 132 or the comparison vector 134. As a simple example, the initialization vector 132 may be <0011> and the comparison vector 132 may be <1100>. The bit-write vector 136 may be <1010>. It then follows that the selected vector 138 may be <1001>. A comparator 118 may compare the selected vector 138 with stored data 140 associated with the memory array 104.

Incorrect writing of the memory array 104 based on the bit-write functionality associated with the bit-write vector circuitry 116 may cause the selected vector 138 to be different from the compared vector 140. As the BIST engine 102 checks, sequentially or otherwise, all of the memory addresses 131 associated with the memory array 104, the errors are stored in sticky bit error latches 120. The sticky bit error latches 120 may include stored errors associated with the memory addresses 124. The sticky bit error latches 120 may be associated with repair circuitry 122. The repair circuitry 122 may be configured to repair damaged, improperly manufactured, or inoperable portions of the memory array 104. Such portions may be defined by the error state of the sticky bit error latches 120 and the address vector 124 under test. As an example, the repair circuitry 122 may isolate the damaged memory addresses 131 of the memory array 104 such that they are not used by the memory array 104 during operation. The memory array 104 may include a register 142 or another implement to record inoperable memory cells 130 or repaired memory cells 130 as provided by the repair circuitry 122.

Figure 1B:
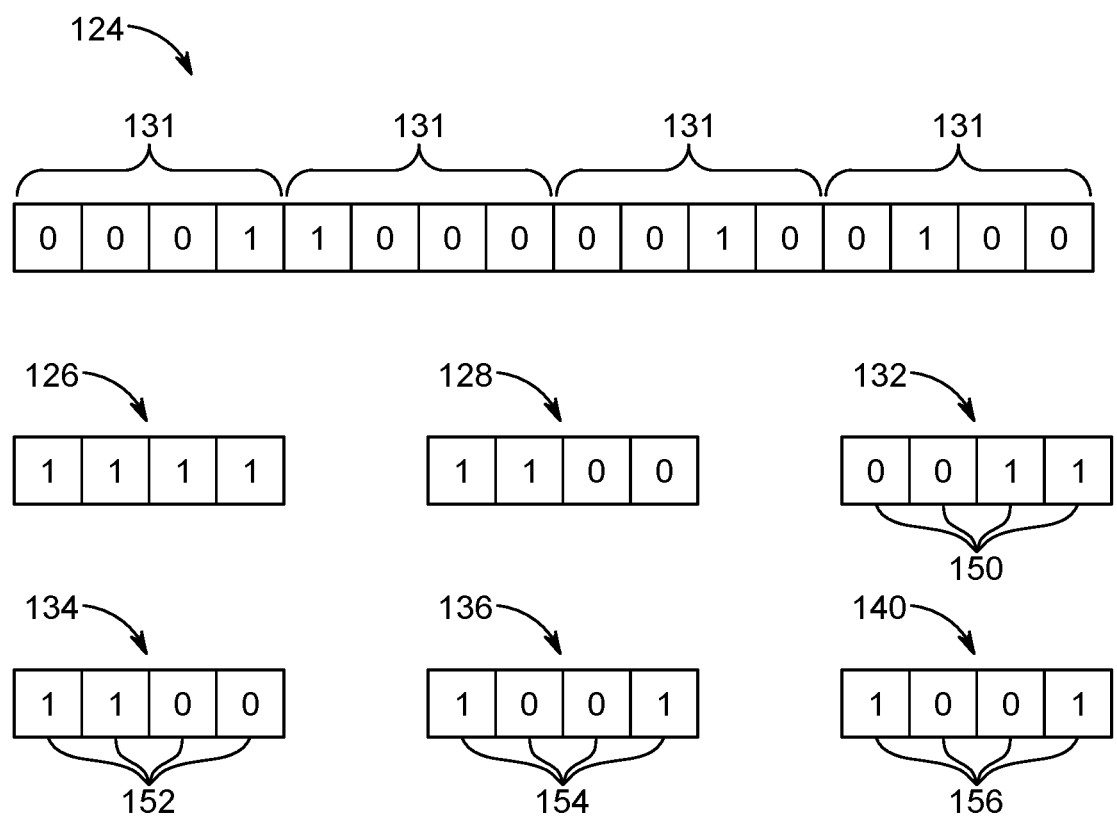
FIG. 1B illustrates vectors having respective bit values in accordance with one or more embodiments of the present invention.

Referring to FIG. 1B, a plurality of vectors in accordance with one or more embodiments of the present invention is shown. The address vector 124 includes memory addresses 131. The address vector 124 may be any size and include any number of memory addresses 131. The read-write vector 126 may include particular read-write vector values relative to memory addresses 131. The write-data vector 128 may include write-data vector values to be used for writing data to the memory array 104. The initialization vector 132 may include initialization vector values 150. The initialization vector values 150 may be based on hardcoded information for generating the initialization vector 108.

The comparison vector 134 may include comparison vector values 152. The comparison vector values 152 may be based on the initialization vector 132 or the initialization vector values 150. That is, the initialization vector 132 may be used to generate the read write vector 126 or the write-data vector 128 to form the comparison vector 134. The bit-write vector 136 may include logical values or bit-write vector values 154 to define bit-write enablement (e.g., permit or deny bit-write operations). Bit-write operations may be defined by the BIST engine 102 or originate from another data source. The stored vector 140 includes stored vector values 156. The stored vector values 156 are based on the data written to the memory array 104.

The bit-write vector circuitry 116 may further generate a control signal 160. The control signal 160 may be based on the bit-write vector 136 or be equal to the bit-write vector 136. The control signal 160 may be sent to the comparator 118 to enable or disable the comparator 118. The control signal 160 may be sent to the sticky bit error latches 120 to enable or disable the sticky bit error latches 120. The control signal 160 may be a clock signal. As an example, the control signal 160 may be inactive when the bit-write vector 136 is entirely inactive. The control signal 160 may enable or disable particular bits of the stick bit error latches 120.

Figure 2:
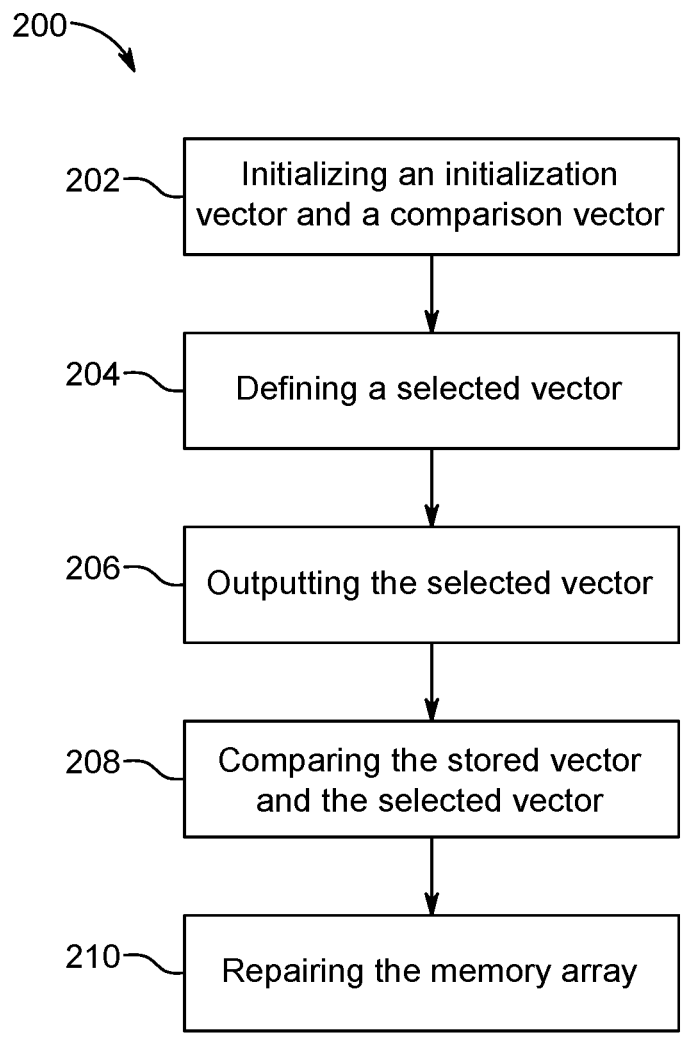
FIG. 2 illustrates a method of using a BIST engine to validate data written to a memory array in accordance with one or more embodiments of the present invention.

Referring to FIG. 2, a method 200 in accordance with one or more embodiments of the present invention is shown. The method 200 illustrates a process for providing a BIST for bit-write enabled memory arrays in accordance with one or more embodiments of the present invention. It should be appreciated that any of the steps or blocks shown in FIG. 2 may be rearranged, omitted, or repeated. Further, the blocks may be performed in parallel or in sequence. The method 200 may include initializing an initialization vector 132 and a comparison vector 134 in block 202. The initialization vector 132 may be based on any number of initialization values, including hardcoded or designed parameters. The initialization vector 132 may be randomly or pseudo-randomly generated to provide the proper test vectors for the BIST engine 102. The comparison vector 134 may be based on the initialization vector 132. The comparison vector 134 may be based on the read-write vector 126.

In block 204, the selected vector 138 is defined. The selected vector 138 may be defined by any apparatus or implement, including selector 114. The selected vector 138 may be based on the initialization vector 132, the comparison vector 134, the bit-write vector 136, or a combination thereof. The selected vector 138 may be selected according to the bit-write vector 136 such that logic therein (TRUE or FALSE bit-values) provides selection of the bit values of the initialization vector 132 or the comparison vector 134. The selected vector 138 may be outputted. The selected vector 138 may be outputted along a bit path having distinct bit-channels for each bit of the selected vector 138 in block 206. The outputted selected vector 138 may be received by a comparator 118.

In block 208, the stored vector 140 is compared with the selected vector 138. The comparator 118 may do the comparison. The comparison may be a bitwise comparison. Each individual bit that is determined incorrect may be further repaired. An error may be outputted from the comparator 118 to a sticky bit error latch for associating the erroneous bit with the memory address 124 tested.

In block 210, the memory array 104 may be repaired. The repair may include isolating the faulty memory blocks or individual cells associated with the particular testing sequence. The repair may include storing faulty memory locations within memory or registers of the memory array 104.

Those versed in the art will readily appreciate that the vectors and data discussed herein may include any number of bits having logical values or digital values that define the vector. The vector may be an array or other designation of data organization and structure. The vector may correspond to several communications channels or bit paths configured to transmit logical data within the vector or array. Such communications, bit paths, or bit channels may be unique or multiplexed to propagate the proper data to the respective destination.

Circuitry refers to any combination of logic, wires, fundamental components, transistors, diodes, latches, switches, flip-flops, half-adders, full-adders, carry-save adders, or other implements, that may be arranged to carry the intended output or disclosed operations.

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

In an exemplary embodiment, the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

The instructions disclosed herein, which may execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. Data storage circuitry for storing digital information readable by a computer comprising:
   a built-in self-test (BIST) engine;
   a memory array including memory cells, the memory array configured to:
      store data based on a read-write vector associated with an address vector that includes memory addresses and according to a bit-write vector that defines bit-write enablement for the memory addresses; and
      output a stored data vector;
   a selector configured to receive the bit-write vector, and to output a selected vector based on an initialization vector and a comparison vector based at least in part on the bit-write vector; and
   a comparator configured to receive the stored data vector and the selected vector, and to output an error based on discrepancies between the stored data vector and the selected vector.

2. The data storage circuitry of claim 1, further comprising initialization vector circuitry configured to generate the initialization vector.

3. The data storage circuitry of claim 1, further comprising comparison vector circuitry configured to generate the comparison vector based on the initialization vector.

4. The data storage circuitry of claim 1, wherein the memory cells are dynamic random-access memory cells.

5. The data storage circuitry of claim 1, wherein the selector is a multiplexor having a control signal input based on the bit-write vector.

6. The data storage circuitry of claim 1, further comprising write vector circuitry configured to generate the read-write vector based on the initialization vector.

7. The data storage circuitry of claim 1, wherein the address vector defines a predetermined set of memory cells.

8. The data storage circuitry of claim 7, wherein the memory array includes repair circuitry configured to isolate the predetermined set of memory cells.

9. The data storage circuitry of claim 8, wherein the repair circuitry is configured to isolate the predetermined set of memory cells when the error is present.

10. The data storage circuitry of claim 8, wherein the repair circuitry is configured to isolate a portion of the predetermined set of memory cells based on the error.

11. The data storage circuitry of claim 10, wherein the portion is defined by the bit-write vector.

12. A method for operating a built-in self-test (BIST) engine associated with a memory array, the method comprising:
   comparing, by data storage circuitry, a stored vector received from the memory array defined by a bit-write vector and a selected vector received from the BIST engine defined by the bit-write vector; and
   repairing, by the data storage circuitry, the memory array according to the comparing such that differences between the stored vector and the selected vector are stored as repaired memory addresses in the memory array.

13. The method of claim 12, further comprising initializing an initialization vector having initialization vector values and comparison vector based on the initialization vector having comparison vector values defined according to write vector circuitry;
   defining the selected vector based on the initialization vector and the comparison vector according to the bit-write vector having bit-write vector values that represent selection logic; and
   outputting the selected vector.

14. The method of claim 12, wherein the comparing is a bit-wise comparison and unequal bit values of the selected vector and the stored vector define inoperable portions of the memory array, and the repairing deactivates the inoperable portions.

15. The method of claim 14, wherein the inoperable portions are memory cells of the memory array.

16. A method for operating a built-in self-test (BIST) engine associated with a memory array, the method comprising:
   initializing, by data storage circuitry, an initialization vector having initialization vector values and comparison vector based on the initialization vector having comparison vector values defined according to write vector circuitry;
   defining, by the data storage circuitry, a selected vector based on the initialization vector and the comparison vector according to a bit-write vector having bit-write vector values that represent selection logic; and
   outputting the selected vector.

17. The method of claim 16, further comprising receiving a stored vector having stored vector values from the memory array; and comparing the stored vector and the selected vector.

18. The method of claim 17, further comprising repairing the memory array according to the comparing of the stored vector and the selected vector.

19. The method of claim 18, wherein the comparing is a bit-wise comparison and unequal bit values of the selected vector and the stored vector defines inoperable portions of the memory array, and the repairing deactivates the inoperable portions.

20. The method of claim 19, wherein the selected vector is defined by multiplexing the initialization vector with the comparison vector according to the bit-write vector.

* * * * *